United States Patent [19]
Williams

[11] Patent Number: 5,872,473
[45] Date of Patent: Feb. 16, 1999

[54] LOW SPEED DRIVER FOR USE WITH THE UNIVERSAL SERIAL BUS

[75] Inventor: Timothy J. Williams, Bellevue, Wash.

[73] Assignee: Cypress Semiconductor Corp., San Jose, Calif.

[21] Appl. No.: 828,537

[22] Filed: Mar. 31, 1997

[51] Int. Cl.$^6$ .............................. H03K 3/00; H03K 17/16
[52] U.S. Cl. .......................... 327/108; 327/112; 327/379
[58] Field of Search ..................................... 327/108, 109, 327/111, 112, 379–383; 326/26, 27

[56] References Cited

U.S. PATENT DOCUMENTS

| | | | |
|---|---|---|---|
| 4,857,863 | 8/1989 | Ganger et al. | 327/108 |
| 5,469,096 | 11/1995 | Nessi et al. | 327/112 |
| 5,537,067 | 7/1996 | Carvajal et al. | 327/112 |
| 5,546,045 | 8/1996 | Sauer | 327/379 |
| 5,675,813 | 10/1997 | Holmdahl | 395/750 |

FOREIGN PATENT DOCUMENTS 9736230  10/1997  WIPO .

OTHER PUBLICATIONS

Design Guide for a Low Speed Buffer for the Universal Serial Bus Revision 1.1 Dec., 1996 Inten Corporation.
Universal Serial Bus Specification, Jan. 15, 1996, pp. 111–143.

*Primary Examiner*—Toan Tran
*Attorney, Agent, or Firm*—Maiorana & Acosta, P.C.; Christopher P. Maiorana

[57] ABSTRACT

A circuit comprising a switch section configured to generate a first and second control signal. A pull section may receive the first and second control signals to generate an output. A capacitor may be coupled between the switch section and the pull section for coupling the output to the switch section.

14 Claims, 2 Drawing Sheets

LOW SPEED DRIVER FOR USE WITH THE UNIVERSAL SERIAL BUS

FIELD OF THE INVENTION

The present invention relates to low speed drivers generally and, more particularly, to a low speed driver for use with the universal serial bus that does not require the use of operational amplifiers.

BACKGROUND OF THE INVENTION

The universal serial bus (USB) has a variety of operating modes that allow a number of computer peripherals to be connected to a generic port. One of the modes of a USB device is a low speed mode. While operating in the low speed mode, the outputs of a USB device are generally very slow transitioning signals. Another design criteria involved with USB devices is that there may be a large variation in the load placed on the device. As a result, the USB device must be designed to provide the proper speed at the output across wide load variations.

Referring to FIG. 1, a conventional USB driver circuit 10 is shown which implements operational amplifiers to control the transitioning of an output signal. The circuit 10 generally requires the use of an operational amplifier 12 and an operational amplifier 14 to control the signal presented at the output pad 16. The circuit 10 also requires a variety of transistors, a bias circuit 18, a predriver circuit 20 and a clamp circuit 22. More information regarding the circuit of FIG. 1 may be found in the paper "Design Guide For A Low Speed Buffer For The Universal Serial Bus", published in December of 1996, the appropriate sections which are hereby incorporated by reference.

Each universal serial bus device has two outputs, a plus output and a minus output. The circuit 10 would have to be implemented, at a minimum, at each of the plus and minus outputs. In an application that provides a number of universal serial bus outputs on a single device, the number of instances that the circuit 10 would have to be duplicated increases accordingly. As a result, it is desirable for the number of components in the circuit 10 be kept to a minimum in order to reduce the overall area required to implement the plurality of required buffers at the various outputs.

SUMMARY OF THE INVENTION

The present invention concerns a circuit comprising a switch section configured to generate a first and second control signal. A pull section may be configured to receive the first and second control signal and to generate an output. A capacitor may be coupled between the switch section and the pull section for coupling the output to the switch section.

An advantage with the present invention is that the switches may be controlled using external logic such as a microprocessor. Pullup and pulldown devices may be implemented prior to the output with a capacitor providing feedback between the output signal and the switches. The capacitor generally reacts to how fast the output signal is changing and provides a signal to adjust the driver accordingly.

Other objects, features and advantages of the present invention include providing a driver that generates a low speed transitioning output that may be driven into a variable impedance load without the requirement of the implementation of operational amplifiers or other devices which take up a large amount of circuit area.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figures 1, 2:
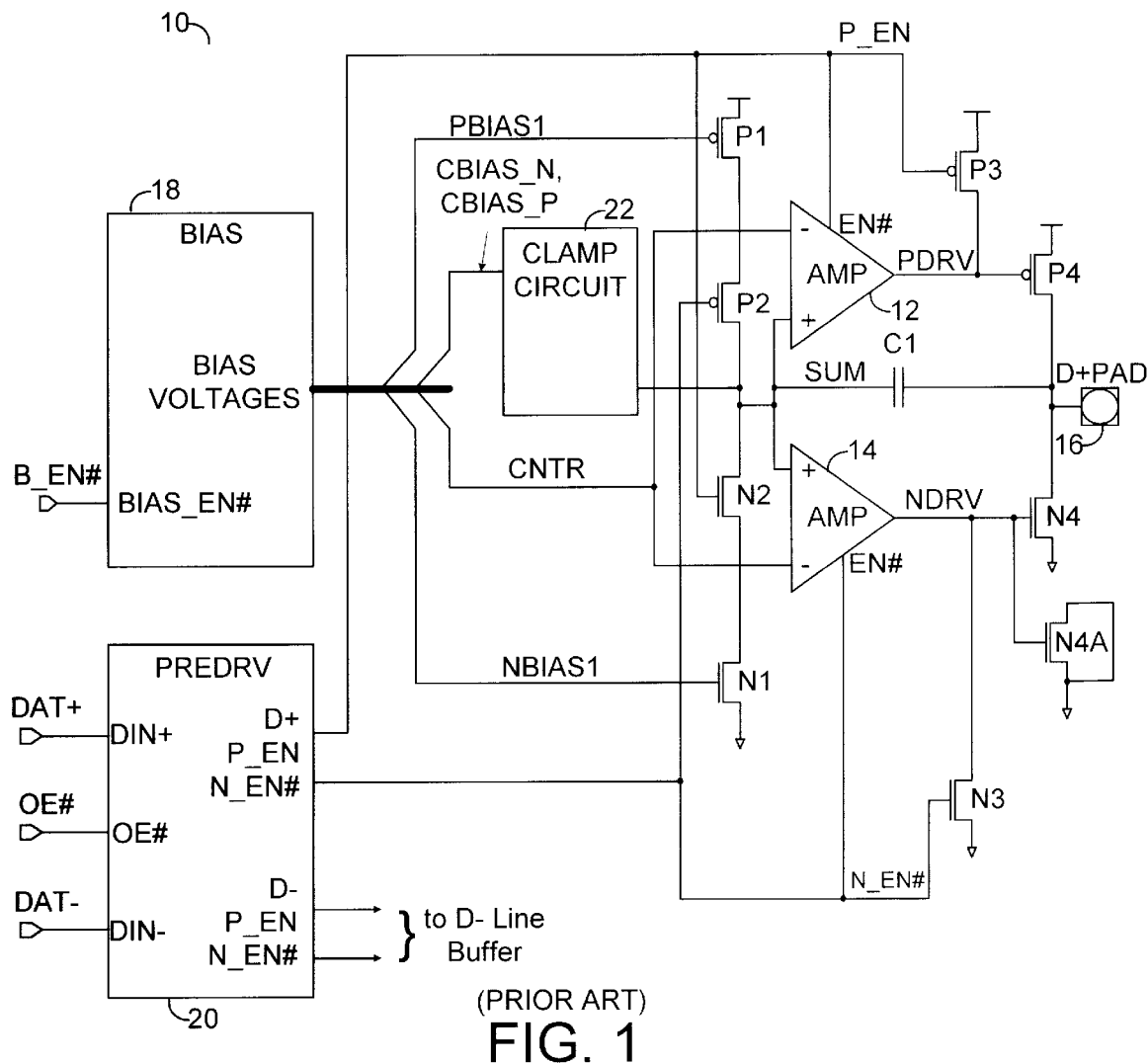
FIG. 1 is a circuit diagram of a conventional buffer for use in low speed applications.
FIG. 2 is a block diagram of a preferred embodiment of the present invention.

Referring to FIG. 2, a diagram 30 is shown in accordance with a preferred embodiment of the present invention. The circuit 30 generally comprises a logic section (or circuit) 32, a driver section (or circuit) 34 and an output (or load) section 36. The logic section 32 generally provides information to the driver section 34 which may be used to control a signal presented to the output section 36.

Figure 3:
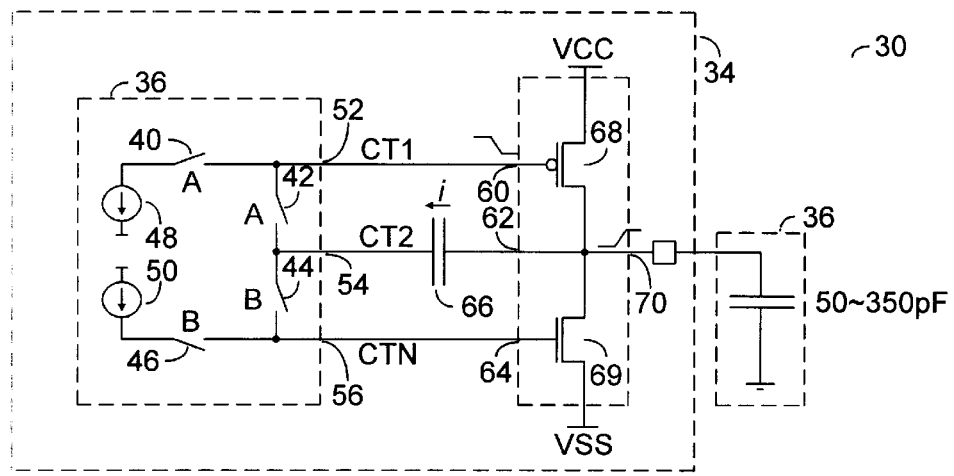
FIG. 3 is a circuit diagram of a preferred embodiment of the present invention.

Referring to FIG. 3, a more detailed diagram of a portion of the circuit 30 is shown. The driver section 34 generally comprises a switch section 36 and a pull section 38. The pull section 38 generally comprises a pullup transistor 68 and a pulldown transistor 69. The switch section 36 generally comprises a switch 40, a switch 42, a switch 44, a switch 46, a current source 48, a current source 50, an output 52, an output 54 and an output 56. The switches 40 and 42 are generally indicated as the "A" switches. The switches 44 and 46 are generally indicated as the "B" switches. The switch 40 is generally coupled between the current source 48 and the output 52. One side of the switch 42 is generally coupled between the output 52 and one side of the switch 44. The other side of the switch 44 is generally coupled to one side of the switch 46 and to the output 56. The other side of the switch 46 is generally coupled to the current source 50. The output 52 generally presents a signal CT1 to an input 60 of the pull section 38. The output 54 of the switch section 36 generally presents a signal CT2 to an input 62 of the pull section 38 through a capacitor 66. The output 56 generally presents a signal CTN to an input 64 of the pull section 38. The pull section 38 generally presents an output signal OUT at an output 70. The pullup transistor 68 may be implemented as one or more pullup devices each configured to receive the signal CT1 and to provide a positive transition at the output 70. The pulldown transistor 69 may be implemented as one or more pulldown devices each configured to receive the signal CTN and to provide a negative transition at the output 70.

The "A" switches 40 and 42 are generally turned on during a positive transition of the output signal OUT while the "B" switches are generally turned on during a negative transition of the output signal OUT. The operation of the "A" switches and the "B" switches may be controlled by the logic section 32 (shown in FIG. 2) which may be implemented as an external device, such as a microprocessor, EPROM or other programmable device. The "A" and "B" switches may be implemented in a variety of ways in order to meet the design criteria of a particular application. A simple implementation of the "A" and "B" switches may be accomplished by using a transistor having a gate coupled to an input received from the logic block 30 or other control device. The capacitor 66 generally provides a feedback between the output 70, which responds to how fast the outputs are changing and provides a feedback signal used to adjust the strength of the pull section 38.

Figure 4:
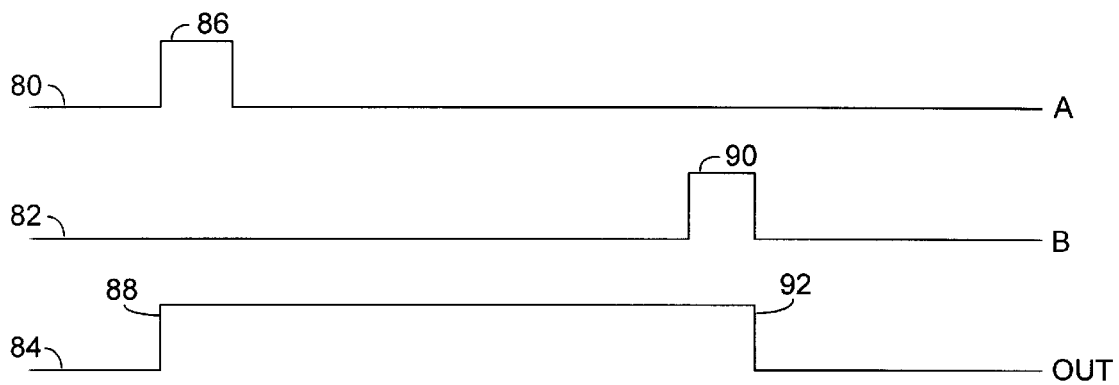
FIG. 4 is a timing diagram illustrating the logic used in turning on the switches of FIG. 3.

Referring to FIG. 4, a timing diagram of the signals used to turn on the "A" switches and the "B" switches is shown. A waveform 80 represents the signals presented to the "A" switches. A waveform 82 represents a signal presented to the "B" switches. A waveform 84 represents a signal OUT presented at the output 70. When the waveform 80 is high at a pulse 86, the signal OUT generally provides a positive transition at an edge 88. When the waveform 82 is high at a pulse 90, the signal OUT generally provides a negative transition at an edge 92. As a result, the waveform 80 generally controls the rising edges of the signal OUT while the waveform 82 generally controls the negative edges of the signal OUT. When the waveform 80 is high at the pulse 86, the "A" switches 40 and 42 are closed which generally provides the signal CT1 which may turn on the pullup transistor 68 of the pullup section 38. When the waveform 82 is high at the pulse 90, the "B" switches 44 and 46 are closed which generally provides the signal CTN at the input 64 which generally turns on the pulldown transistor 69. The polarity of the signal CT1 and CTN, as well as the polarity of the transitions of the waveform 84 may be adjusted to meet the design criteria of a particular application.

The source of the pullup transistor 68 is generally coupled to a supply voltage (e.g., VCC). The drain of the transistor 68 is generally coupled to the output 70 as well as to the drain of the transistor 69. The source of the transistor 69 is generally coupled to a ground voltage (e.g., VSS). The pullup transistor 68 may be implemented as a single transistor having a strength sufficient to provide a pullup effect at the output 70. However, the pullup transistor 68 may be implemented as one or more transistors, or other devices, in order to meet the design criteria of a particular application. Similarly, the pulldown transistor 69 may be implemented as a single transistor having sufficient strength to provide a pulldown effect at the output 70. However, the pulldown transistor 69 may be implemented as one or more transistors, or other devices, in order to meet the design criteria of a particular application.

By having the inputs 60 and 64 controlled by the "A" switches 40 and 42 and the "B" switches 44 and 46, the transistors 68 and 69 may be turned on and off at the appropriate times during a low speed transition, as may be encountered in computer applications such as the universal serial bus.

The output section 36 may comprise a variable impedance load that may vary, in one example such as in a typical USB application, between 50–350 pF. However, the particular capacitance of the output section 36 may vary accordingly to meet the design criteria of a particular application. The operation of the switch section 36 may be implemented independently of the amount of capacitance realized at the output section 36.

While the invention has been particularly shown and described with reference to the preferred embodiments thereof, it will be understood by those skilled in the art that various changes in form and details may be made without departing from the spirit and scope of the invention.

I claim:

1. A circuit comprising:

a switch section comprising a first switch coupled to a first current source, a second switch coupled to a second current source, a third switch coupled between said first switch and a capacitor and a fourth switch coupled between said second switch and said capacitor, said first and second switches configured to generate a first control signal and a second control signal;

a pull section configured: (i) to receive said first and second control signals and (ii) to generate an output; and said capacitor coupled between said switch section and said output of said pull section.

2. The circuit according to claim 1 wherein said pull section comprises:

one or more pullup devices each configured: (i) to receive said first control signal and (ii) to provide a positive transition at said output; and one or more pulldown devices each configured: (i) to receive said second control signal and (ii) to provide a negative transition at said output.

3. The circuit according to claim 1 wherein said switches are actuated in response to two or more switch signals.

4. The circuit according to claim 3 wherein said two or more switch signals are generated by a programmable device.

5. The circuit according to claim 4 wherein said programmable device comprises a microprocessor.

6. The circuit according to claim 1, wherein the output of said pull section is coupled to a data bus, said circuit and said data bus form an output buffer.

7. A circuit comprising:

means for generating a first and a second control signal comprising a first switch coupled to a first current source, a second switch coupled to a second current source, a third switch coupled between said first switch and a capacitor, and a fourth switch coupled between said second switch and said capacitor said first and second switches configured to generate said first control signal and said second control signal;

means for generating an output in response to said first and second control signals; and said capacitor for coupling said output to said means for generating said control signals.

8. The circuit according to claim 7 wherein said means for generating said output signal comprises:

one or more pullup devices each configured: (i) to receive said first control signal and (ii) to provide a positive transition at said output; and one or more pulldown devices each configured: (i) to receive said second control signal and (ii) to provide a negative transition at said output.

9. The circuit according to claim 7 wherein said switches are actuated in response to two or more switch signals.

10. The circuit according to claim 9 wherein said two or more switch signals are generated by a programmable device.

11. The circuit according to claim 10 wherein said programmable device comprises a microprocessor.

12. A method for driving a variable load comprising the steps of:

(a) generating a first and second control signal in response to a first switch coupled to a first current source, a second switch coupled to a second current source, a third switch coupled between said first switch and a capacitor and a fourth switch coupled between said second switch and said capacitor, said first and second switches configured to generate said first control signal and said second control signal;

(b) generating an output in response to said first and second control signals; and (c) coupling said output to said first and second control signals using said capacitor.

13. The method according to claim 12, wherein said switches are actuated in response to two or more switch signals.

14. The circuit according to claim 2, wherein said one or more pullup devices comprise one or more pullup transistors and said one or more pulldown devices comprise one or more pulldown transistors.

* * * * *